United States Patent
Kargar et al.

(10) Patent No.: US 8,947,167 B2
(45) Date of Patent: Feb. 3, 2015

(54) REFERENCE-LESS FREQUENCY DETECTOR

(71) Applicant: Broadcom Corporation, Irvine, CA (US)

(72) Inventors: Mahyar Kargar, Irvine, CA (US); Siavash Fallahi, Newport Coast, CA (US); Namik Kocaman, San Clemente, CA (US); Mehdi Khanpour, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 21 days.

(21) Appl. No.: 13/931,189

(22) Filed: Jun. 28, 2013

(65) Prior Publication Data

US 2013/0285752 A1    Oct. 31, 2013

Related U.S. Application Data

(63) Continuation of application No. 13/158,121, filed on Jun. 10, 2011, now Pat. No. 8,502,609.

(51) Int. Cl.
| | |
|---|---|
| *H03L 7/091* | (2006.01) |
| *G01R 23/02* | (2006.01) |
| *G01R 25/00* | (2006.01) |
| *H03D 13/00* | (2006.01) |
| *H03L 7/00* | (2006.01) |
| *H03L 7/08* | (2006.01) |
| *H03L 7/113* | (2006.01) |
| *G01R 23/15* | (2006.01) |

(52) U.S. Cl.
CPC .............. *G01R 23/02* (2013.01); *G01R 25/00* (2013.01); *H03D 13/00* (2013.01); *H03L 7/00* (2013.01); *H03L 7/0807* (2013.01); *H03L 7/091* (2013.01); *H03L 7/113* (2013.01); *H03L 2207/06* (2013.01); *G01R 23/15* (2013.01)
USPC .................................. 331/25; 327/9; 375/375

(58) Field of Classification Search
CPC ........ G01R 23/02; G01R 25/00; H03D 13/00; H03D 13/003; H03D 13/004; H03D 13/005; H03D 13/006; H03L 7/085; H03L 7/089; H03L 7/091
USPC .......... 327/2, 3, 5, 7, 9, 147, 156; 331/11, 16, 331/17, 25, 34, 44; 375/373–376
See application file for complete search history.

(56) References Cited

U.S. PATENT DOCUMENTS

| | | | |
|---|---|---|---|
| 5,394,444 A | | 2/1995 | Silvey et al. |
| 5,446,420 A | | 8/1995 | Westwick |
| 6,055,286 A | * | 4/2000 | Wu et al. ....................... 375/375 |
| 6,081,572 A | * | 6/2000 | Filip .............................. 375/376 |
| 6,104,251 A | | 8/2000 | Ramey et al. |
| 6,265,902 B1 | | 7/2001 | Klemmer et al. |
| 6,466,058 B1 | | 10/2002 | Goldman |
| 6,545,546 B2 | * | 4/2003 | Takeshita et al. ............... 331/11 |

(Continued)

*Primary Examiner* — Levi Gannon
(74) *Attorney, Agent, or Firm* — Sterne, Kessler, Goldstein & Fox P.L.L.C.

(57) ABSTRACT

Embodiments provide a reference-less frequency detector that overcomes the "dead zone" problem of conventional circuits. In particular, the frequency detector is able to accurately resolve the polarity of the frequency difference between the VCO clock signal and the data signal, irrespective of the magnitude of the frequency difference and the presence of VCO clock jitter and/or ISI on the data signal.

20 Claims, 11 Drawing Sheets

(56) References Cited

U.S. PATENT DOCUMENTS

| | | |
|---|---|---|
| 6,552,618 B2 | 4/2003 | Nelson et al. |
| 6,614,314 B2 | 9/2003 | D'Haene et al. |
| 6,686,804 B1 | 2/2004 | Adams et al. |
| 6,707,319 B2 | 3/2004 | Yoshimura |
| 6,853,696 B1 | 2/2005 | Moser et al. |
| 6,915,081 B2 * | 7/2005 | Takeshita et al. ............. 398/188 |
| 6,937,069 B2 | 8/2005 | Galloway et al. |
| 7,053,719 B2 | 5/2006 | Steinbach et al. |
| 7,103,337 B2 | 9/2006 | Uozumi et al. |
| 7,154,348 B2 | 12/2006 | Lee |
| 7,315,218 B1 | 1/2008 | Fernandez |
| 7,486,146 B2 | 2/2009 | Lin |
| 7,486,147 B2 | 2/2009 | Khorram |
| 7,680,234 B2 | 3/2010 | Colby et al. |
| 7,738,618 B2 | 6/2010 | Jacobsson et al. |
| 7,746,181 B1 | 6/2010 | Moyal |
| 7,750,696 B2 | 7/2010 | Wang et al. |
| 7,804,367 B2 | 9/2010 | Lee et al. |
| 8,085,099 B2 | 12/2011 | Pancholi et al. |
| 8,090,335 B1 | 1/2012 | Bataineh |
| 8,179,174 B2 | 5/2012 | Bunch |
| 8,497,708 B2 * | 7/2013 | Mukherjee et al. ............. 327/9 |
| 2012/0313715 A1 | 12/2012 | Kargar et al. |

* cited by examiner

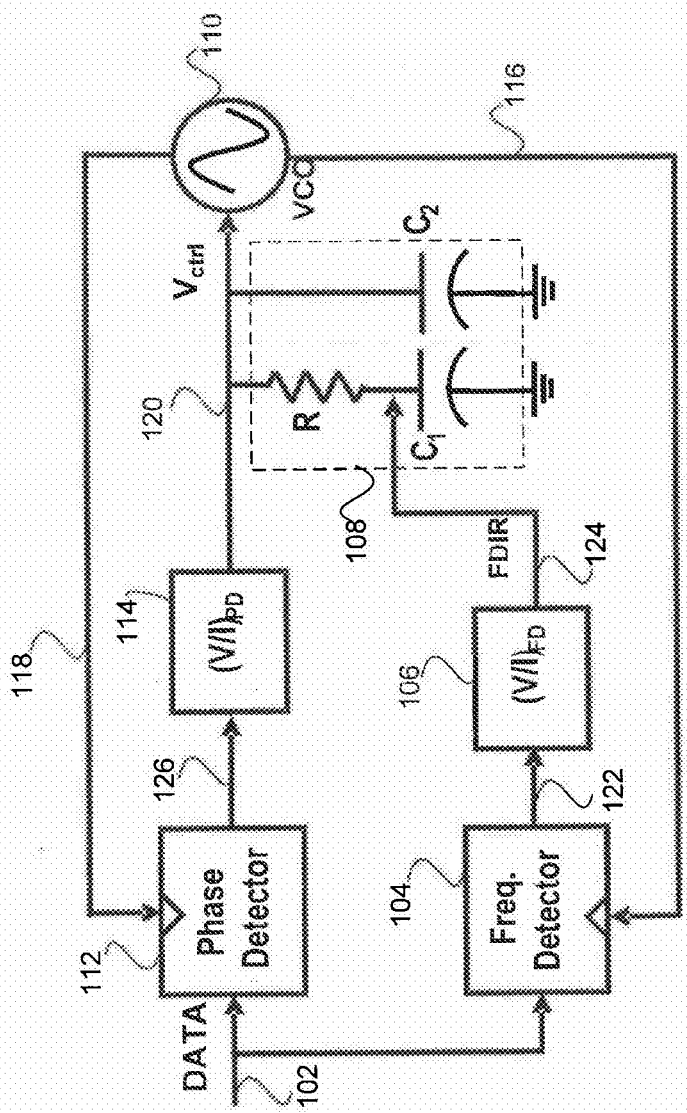
FIG. 1 (Conventional)

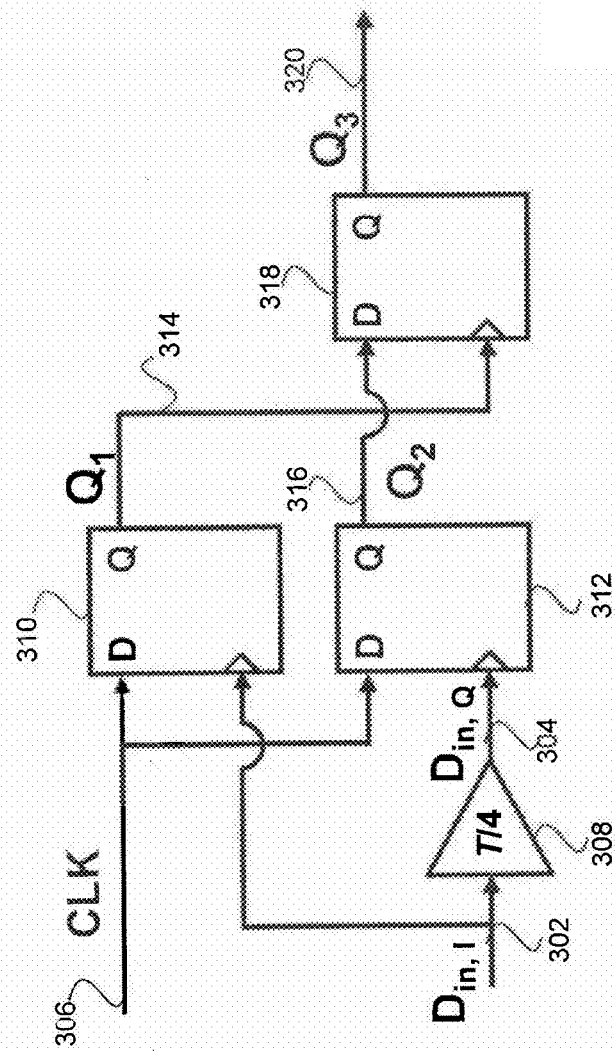
FIG. 3 (Conventional)

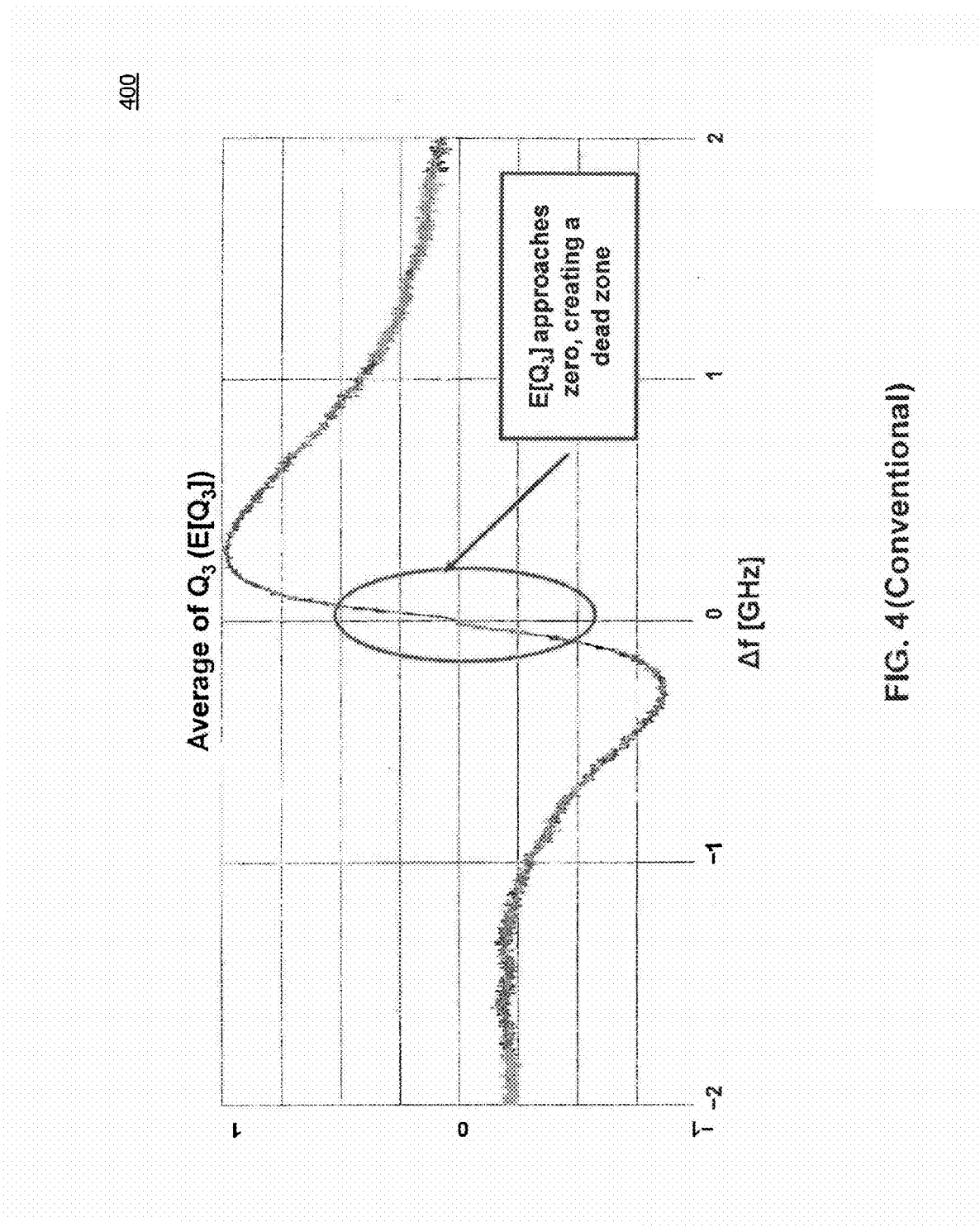
FIG. 4 (Conventional)

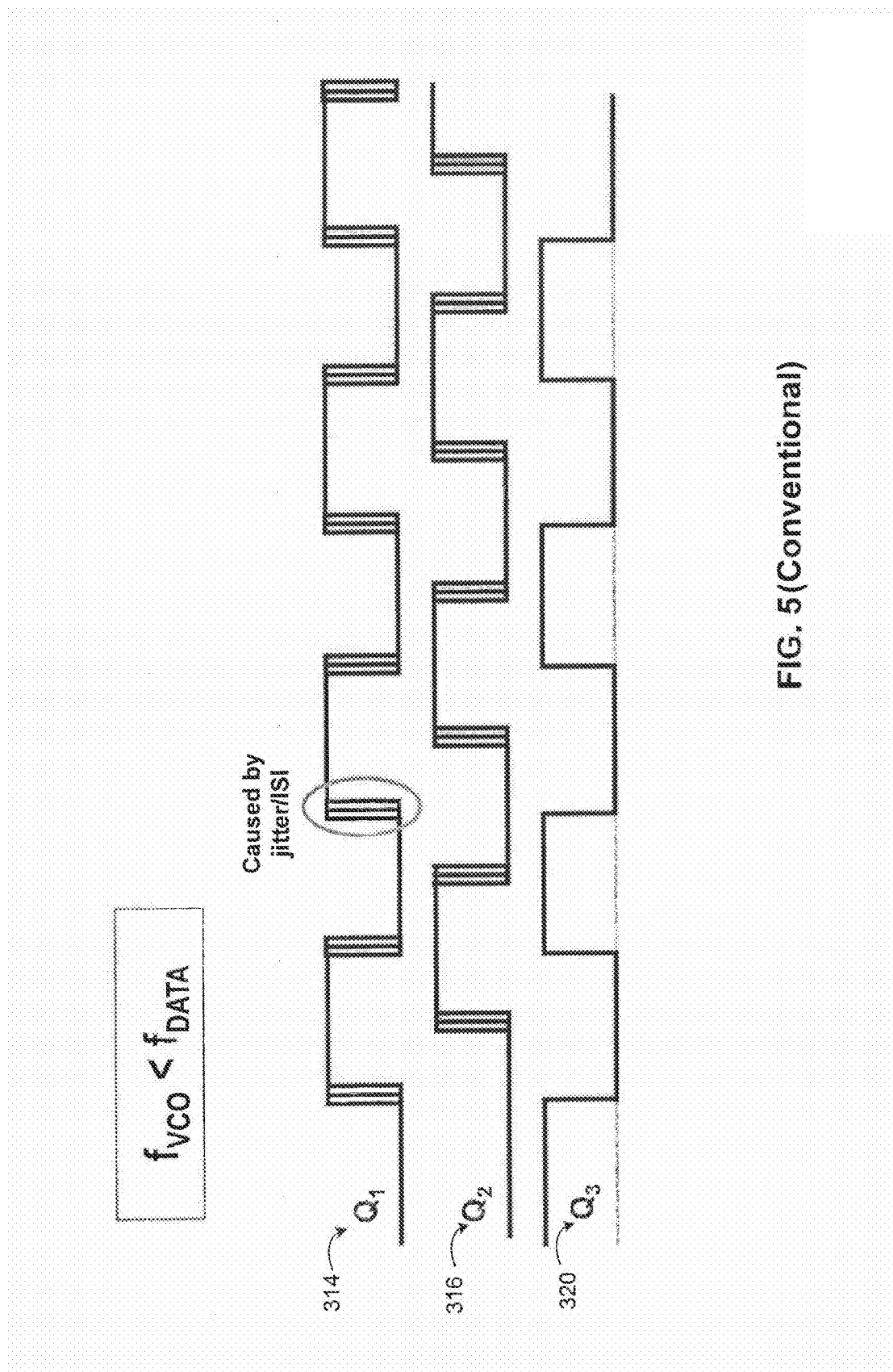
FIG. 5 (Conventional)

REFERENCE-LESS FREQUENCY DETECTOR

CROSS-REFERENCE TO RELATED APPLICATIONS

The present application is a continuation of U.S. application Ser. No. 13/158,121, filed Jun. 10, 2011, now allowed, which is incorporated herein by reference in its entirety.

BACKGROUND

1. Field of the Invention

The present invention relates generally to clock recovery.

2. Background Art

Conventional voltage controlled oscillator (VCO) calibration and/or clock and data recovery (CDR) require a reference clock in order to bring the VCO output frequency in the vicinity of the data rate before phase acquisition.

In certain applications, such as power and/or area-limited circuits, a reference clock may not be present or may be difficult to route. Accordingly, there is a need for reference-less VCO calibration and/or CDR techniques. In addition, it is desirable that VCO calibration and/or CDR techniques be minimally susceptible to the presence of jitter and inter-symbol interference (ISI) on the data and clock jitter in the VCO output.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 illustrates a conventional reference-less clock recovery circuit.

FIG. 3 illustrates a conventional frequency detector.

FIG. 4 illustrates a "dead zone" problem in convention frequency detectors.

FIG. 5 is an example that illustrates a detection failure condition caused by the dead zone problem in conventional frequency detectors.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 2:
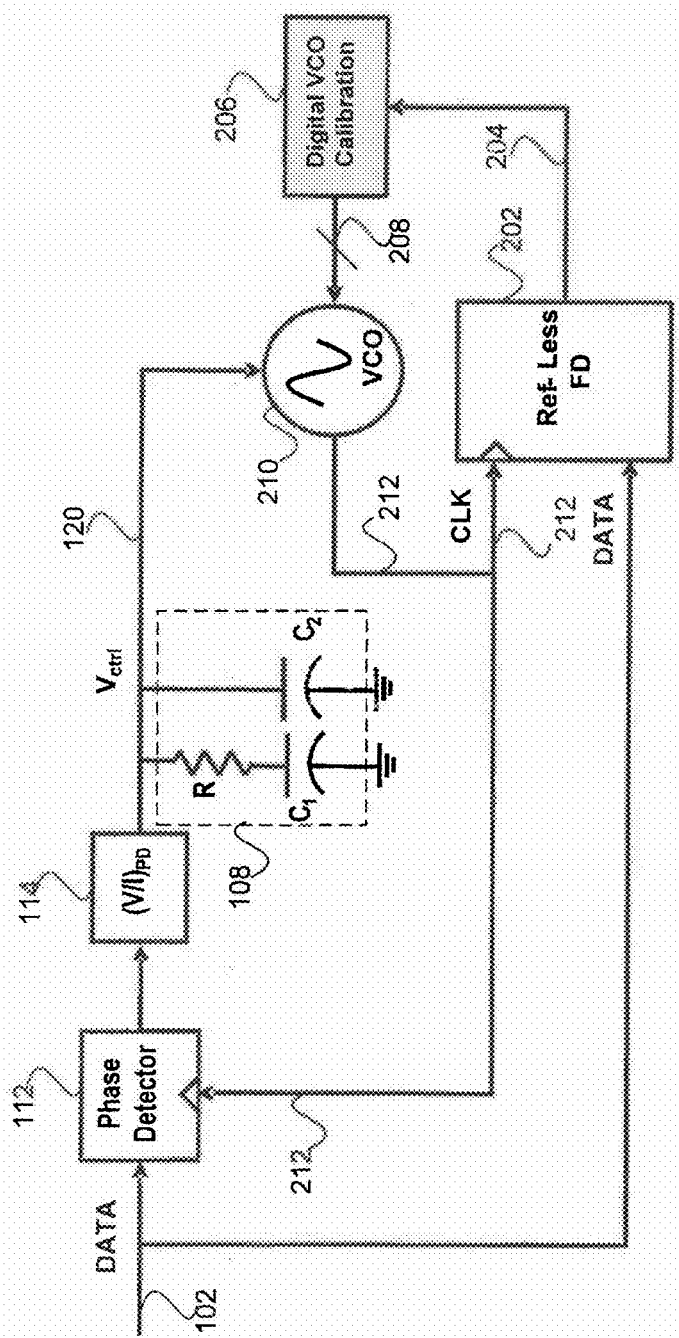
FIG. 2 illustrates an example reference-less clock recovery circuit according to an embodiment of the present invention.

FIG. 1 illustrates a conventional reference-less clock recovery circuit 100. Circuit 100 includes a frequency detection circuit and a phase detection circuit. The frequency detection circuit includes a frequency detector 104, a voltage-to-current (V/I) converter 106, a resistor-capacitor (RC) filter 108, and a voltage controlled oscillator (VCO) 110. The phase detection circuit includes a phase detector 112, a V/I converter 114, and VCO 110.

Frequency detector 104 receives as inputs data signal 102 and the output of VCO 110 via VCO output signal 116. Frequency detector 104 generates a voltage signal 122 based on a frequency difference between data signal 102 and VCO output signal 116. V/I converter 106 converts voltage signal 122 to a current signal 124. From current signal 124, a $V_{ctrl}$ signal 120 is generated across RC filter 108 and at the input of VCO 110.

The frequency detection circuit of circuit 100 ensures that the output frequency of VCO 110 is brought close to the rate of data signal 102.

The output of VCO 110 is provided via VCO output signal 118 to phase detector 112. Phase detector 112 also receives data signal 102, and generates a voltage signal 126 based on a phase difference between data signal 102 and VCO output signal 118. V/I converter 114 converts voltage signal 126 to a current, which causes $V_{ctrl}$ signal 120 across RC filter 108. $V_{ctrl}$ signal 120 controls VCO 110 to shift VCO output signal 118 in phase so as to synchronize data signal 102 and output signal 118 (i.e., lock VCO output signal 118 to data signal 102).

Although circuit 100 allows reference-less clock recovery, calibration of the VCO (i.e., selection of a VCO frequency band of operation) according to the input data rate is not possible in circuit 100 without the presence of a reference clock. In addition, the use of analog feedback loops (which are continuously ON) for both frequency detection and phase detection in circuit 100 makes circuit 100 not very suitable for power-limited applications.

FIG. 2 illustrates an example reference-less clock recovery circuit 200 according to an embodiment of the present invention. Like circuit 100, example circuit 200 includes a frequency detection circuit and a phase detection circuit. The frequency detection circuit includes a reference-less frequency detector 202, a VCO calibration module 206, and a VCO 210. The frequency detection circuit in example circuit allows automatic calibration of VCO 210 so as to optimize the gain of VCO 210 according to the input data rate. The phase detection circuit of circuit 200 includes phase detector 112, V/I converter 114, RC filter 108, and VCO 210.

In operation, when data signal 102 is first received, circuit 200 first performs frequency detection to detect the rate of data signal 102. During the frequency detection phase, the frequency detection circuit of circuit 200 is active, and the phase detection circuit of circuit 200 is disabled.

Reference-less frequency detector 202 receives as inputs data signal 102 and the output 212 of VCO 210. Frequency detector 202 generates an output signal 204, which includes a representation of the frequency difference (including polarity) between data signal 102 and VCO output signal 212. According to embodiments, output signal 204 may analog or digital.

Based on output signal 204, VCO calibration module 206 selects a calibration code 208, which it provides to VCO 210. Calibration code 208 calibrates VCO 210 so as to bring the frequency of VCO output signal 212 close to the rate of data signal 102. In an embodiment, as further described below, VCO 210 is configurable to operate in a plurality of VCO states, and calibration code 208 calibrates VCO 210 by enabling an appropriate one of the plurality of VCO states based on the rate of data signal 102.

Subsequently, the frequency detection circuit of circuit 200 is disabled, and the phase detection circuit of circuit 200 is activated. The phase detection circuit, as described above with respect to circuit 100, operates to lock VCO output signal 212 to data signal 102 by synchronizing VCO output signal 212 and data signal 102.

As described above, VCO calibration module 206 relies on the output signal 204 provided by frequency detector 202 to select a calibration code 208. Accordingly, the ability of VCO calibration module 206 to properly calibrate VCO 210 depends on the ability of frequency detector 202 to accurately determine the frequency difference (including polarity) between data signal 102 and VCO output signal 212.

Conventional frequency detectors, as further described below, suffer from a "dead zone" problem as the frequency difference between data signal 102 and VCO output signal 212 approaches zero. The "dead zone" problem causes the frequency detector to fail to resolve properly the polarity of the frequency difference between data signal 102 and VCO output signal 212, in the presence of jitter in VCO output signal 212 and/or inter-symbol interference (ISI) on data signal 102. The "dead zone" problem is illustrated below with reference to a conventional frequency detector, described in FIG. 3.

FIG. 3 illustrates a conventional binary reference-less frequency detector 300. As shown in FIG. 3, frequency detector 300 includes a delay buffer 308 and D flip-flops 310, 312, and 318.

Frequency detector 300 receives as inputs an in-phase component $D_{in,I}$ 302 of a data signal and a clock signal 306 (from the VCO). $D_{in,I}$ 302 and clock signal 306 are provided as the clock input and the data input, respectively, of D flip-flop 310. D flip-flop 310 samples clock signal 306 at the rising edges of $D_{in,I}$ 302 to generate an output signal $Q_1$ 314.

From in-phase component $D_{in,I}$ 302, a quadrature component $D_{in,Q}$ 304 of the data signal is generated using delay buffer 308. $D_{in,Q}$ 304 and clock signal 306 are provided as the clock input and the data input, respectively, of D flip-flop 312. D flip-flop 312 samples clock signal 306 at the rising edges of $D_{in,Q}$ 304 to generate an output signal $Q_2$ 316.

Signals $Q_1$ 314 and $Q_2$ 316 contain information regarding the frequency difference between the data signal and clock signal 306. Specifically, the period of signals $Q_1$ 314 and $Q_2$ 316 (signals $Q_1$ 314 and $Q_2$ 316 have equal period) is proportional (in an embodiment, inversely proportional) to the frequency difference between the data signal and clock signal 306, and the relative phase shift between signals $Q_1$ 314 and $Q_2$ 316 indicates the polarity of the frequency difference between the data signal and clock signal 306. In particular, when signal $Q_1$ 314 leads signal $Q_2$ 316, clock signal 306 has a lower frequency than the data signal; and when signal $Q_1$ 314 lags signal $Q_2$ 316, clock signal 306 has a higher frequency than the data signal.

Signal $Q_3$ 320 indicates which of signals $Q_1$ 314 and $Q_2$ 316 leads the other, and thus the polarity of the frequency difference between the data signal and clock signal 306. In particular, when signal $Q_1$ 314 leads signal $Q_2$ 316, signal $Q_3$ 320 will be a logic low (e.g., −1), indicating that the frequency of clock signal 306 ($f_{VCO}$) is lower than the frequency of the data signal ($f_{DATA}$) (i.e., $\Delta f = f_{VCO} - f_{DATA} < 0$). On the other hand, when signal $Q_1$ 314 lags signal $Q_2$ 316, signal $Q_3$ 320 will be a logic high (e.g., +1), indicating that the frequency of clock signal 306 ($f_{VCO}$) is higher than the frequency of the data signal ($f_{DATA}$) (i.e., $\Delta f = f_{VCO} - f_{DATA} > 0$).

Typically, the average of signal $Q_3$ 320 ($E[Q_3]$) over a pre-defined time interval is used to determine whether the frequency difference between clock signal 306 and the data signal (i.e., $\Delta f$) is negative or positive. For example, if the average is closer to the logic high value (e.g., +1), then it is determined that $\Delta f$ is positive; and if the average is closer to the logic low value (e.g., −1), then it is determined that $\Delta f$ is negative.

Generally, when $\Delta f$ is large (either positive or negative), the average of signal $Q_3$ 320 is a good indicator of the polarity of $\Delta f$ (even in the presence of clock jitter and/or ISI on the data signal, for example). However, as $\Delta f$ tends towards zero, signal $Q_3$ 320 starts to toggle in the presence of jitter in clock signal 306 and/or ISI on the data signal, for example. This results in the average of signal $Q_3$ 320 (over the pre-defined interval) to approach zero, making it unusable to determine to the polarity of $\Delta f$. This is known as the "dead zone" problem in conventional frequency detectors and is further illustrated below in FIGS. 4 and 5.

FIG. 4 is an example plot 400 of the average of signal $Q_3$ 320 ($E[Q_3]$) versus the frequency difference between clock signal 306 and the data signal ($\Delta f$) in frequency detector 300, in the presence of jitter in clock signal 306 and/or ISI on the data signal. As shown in FIG. 4, when $\Delta f$ is not close to zero, the average of signal $Q_3$ 320 is either positive or negative, unmistakably indicating the polarity of $\Delta f$. However, as $\Delta f$ tends to zero, the average of signal $Q_3$ 320 ($E[Q_3]$) approaches zero also (i.e., the sign of $E[Q_3]$ cannot be resolved), creating what is referred to as a "dead zone." Thus, in the "dead zone," frequency detector 300 fails to resolve the polarity of the frequency difference between clock signal 306 and the data signal ($\Delta f$), in the presence of jitter in clock signal 306 and/or inter-symbol interference (ISI) on the data signal, for example.

FIG. 5 shows example timing diagrams of signals $Q_1$ 314, $Q_2$ 316, and $Q_3$ 320 that illustrate an example frequency detection failure caused by the "dead zone" problem in frequency detector 300. In the example of FIG. 5, the frequency of clock signal 306 ($f_{VCO}$) is lower than the frequency of the data signal ($f_{DATA}$) (i.e., $\Delta f = f_{VCO} - f_{DATA} < 0$). Thus, as shown in FIG. 5, signal $Q_1$ 314 leads signal $Q_2$ 316.

Ideally, if no jitter in clock signal 306 and/or ISI on the data signal is present, signals $Q_1$ 314 and $Q_2$ 316 would also be jitter-free (i.e., clean square waveforms). Because signal $Q_1$ 314 leads signal $Q_2$ 316, signal $Q_3$ 320 would take a logic low value (e.g., −1) at all times. However, in the presence of jitter in clock signal 306 and/or ISI on the data signal, signals $Q_1$ 314 and $Q_2$ 316 may exhibit glitches, which are reflected as unwanted toggling at the zero crossings of signals $Q_1$ 314 and $Q_2$ 316. For example, as shown in FIG. 5, signals $Q_1$ 314 and $Q_2$ 316 may toggle more than one time at low to high or high to low transitions. Consequently, D flip-flop 318 may sample $Q_2$ 316 incorrectly at both the rising and falling edge times of signal $Q_1$ 314 (i.e., referring to FIG. 5 for example, instead of sampling $Q_2$ 316 at rising edge time 502 only, $Q_2$ 316 will also be sampled at falling edge time 504 when $Q_1$ 314 undergoes an unwanted low to high transition at 504), resulting in signal $Q_3$ 320 toggling as shown in FIG. 5 (instead of having a solid logic low value) and to have an average value of zero (over the pre-defined time interval). When that occurs, frequency detector 300 is unable to resolve the polarity of $\Delta f$, and thus the VCO frequency cannot be brought any closer to the data rate of the data signal.

Embodiments of the present invention, as further described below, provide a reference-less frequency detector that overcomes the above described "dead zone" problem of conventional circuits. In particular, the frequency detector is able to accurately resolve the polarity of the frequency difference between the VCO clock signal and the data signal, irrespective of the magnitude of the frequency difference ($\Delta f$) and the presence of VCO clock jitter and/or ISI on the data signal.

Figure 6:
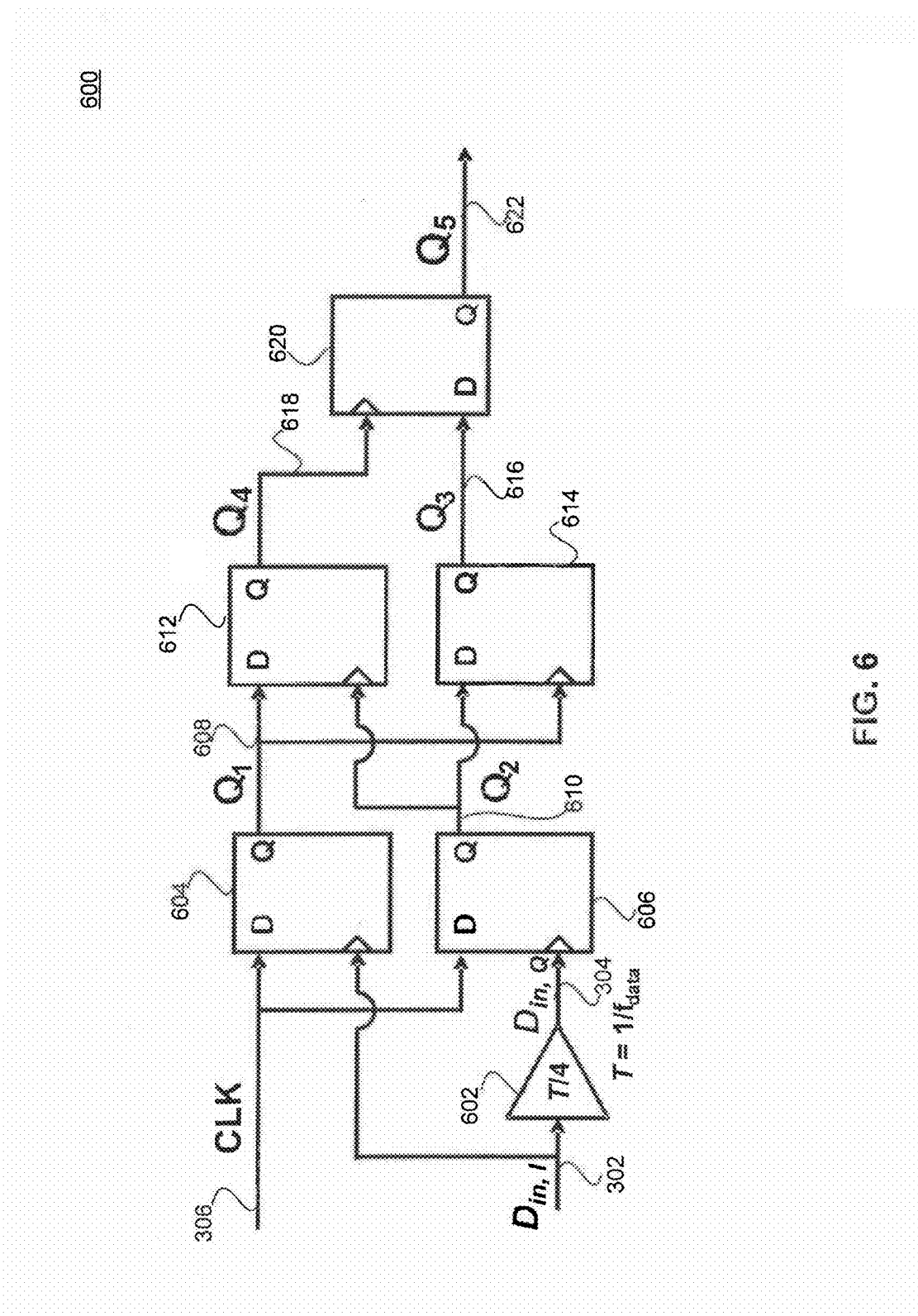
FIG. 6 illustrates an example reference-less frequency detector according to an embodiment of the present invention.

FIG. 6 illustrates an example reference-less frequency detector 600 according to an embodiment of the present invention. Example frequency detector 600 is provided for the purpose of illustration only, and is not limiting of embodiments of the present invention.

As shown in FIG. 6, frequency detector 600 includes a delay buffer 602 and three sampling stages, comprising D flip-flops 604, 606, 612, 614, and 620. In an embodiment, signals in frequency detector 600 are high-speed differential signals, and delay buffer 602 and one or more of D flip-flops 604, 606, 612, 614, and 620 use high-speed common mode logic (CML). As would be understood by a person of skill in the art, frequency detector 600 may be implemented using different components, including, for example, other types of flip-flops, or more generally, any types of latches/sampling circuits.

Like frequency detector 300 described above, frequency detector 600 receives as inputs an in-phase component $D_{in,I}$ 302 of a data signal and a clock signal 306 (from the VCO). $D_{in,I}$ 302 and clock signal 306 are provided as the clock input and the data input, respectively, of D flip-flop 604. D flip-flop 604 samples clock signal 306 at the rising edges of $D_{in,I}$ 302 to generate an output signal $Q_1$ 608. From in-phase component $D_{in,I}$ 302, a quadrature component $D_{in,Q}$ 304 of the data signal is generated using delay buffer 602. $D_{in,Q}$ 304 and clock signal 306 are provided as the clock input and the data input, respectively, of D flip-flop 606. D flip-flop 606 samples clock signal 306 at the rising edges of $D_{in,Q}$ 304 to generate an output signal $Q_2$ 610. Signals $Q_1$ 608 and $Q_2$ 610 are provided as the clock input and the data input, respectively, of D flip-flop 614. D flip-flop 614 samples signal $Q_2$ 610 at the rising edges of signal $Q_1$ 608, to generate an output signal $Q_3$ 616. Alternatively, D flip-flop 610 samples signal $Q_2$ 610 at the falling edges of signal $Q_1$ 608, or at both the rising and falling edges of signal $Q_1$ 608, to generate signal $Q_3$ 616.

Thus, signals $Q_1$ 608, $Q_2$ 610, and $Q_3$ 616 are generated in an identical manner as signals $Q_1$ 314, $Q_2$ 316, and $Q_3$ 320, described above with reference to frequency detector 300. Accordingly, signals $Q_1$ 608, $Q_2$ 610, and $Q_3$ 616 may be used to determine the polarity of $\Delta f$ when $\Delta f$ is outside the "dead zone" range.

To resolve the polarity of $\Delta f$ within the "dead zone" range, signals $Q_1$ 608 and $Q_2$ 610 are further provided as the data input and the clock input, respectively, of D flip-flop 612. D flip-flop 612 samples signal $Q_1$ 608 at the rising edges of signal $Q_2$ 610 to generate an output signal $Q_4$ 618. Alternatively, D flip-flop 612 samples signal $Q_1$ 608 at the falling edges of signal $Q_2$ 610, or at both the rising and falling edges of signal $Q_2$ 610, to generate signal $Q_4$ 618. Subsequently, signals $Q_3$ 616 and $Q_4$ 618 are provided as the data input and the clock input, respectively, of D flip-flop 620. D flip-flop 620 samples signal $Q_3$ 616 at the rising edges of signal $Q_4$ 618 to generate an output signal $Q_5$ 622. Signal $Q_5$ 622, as further described below, can be used to determine the polarity of $\Delta f$ when $\Delta f$ is inside "dead zone" range.

Figure 7:
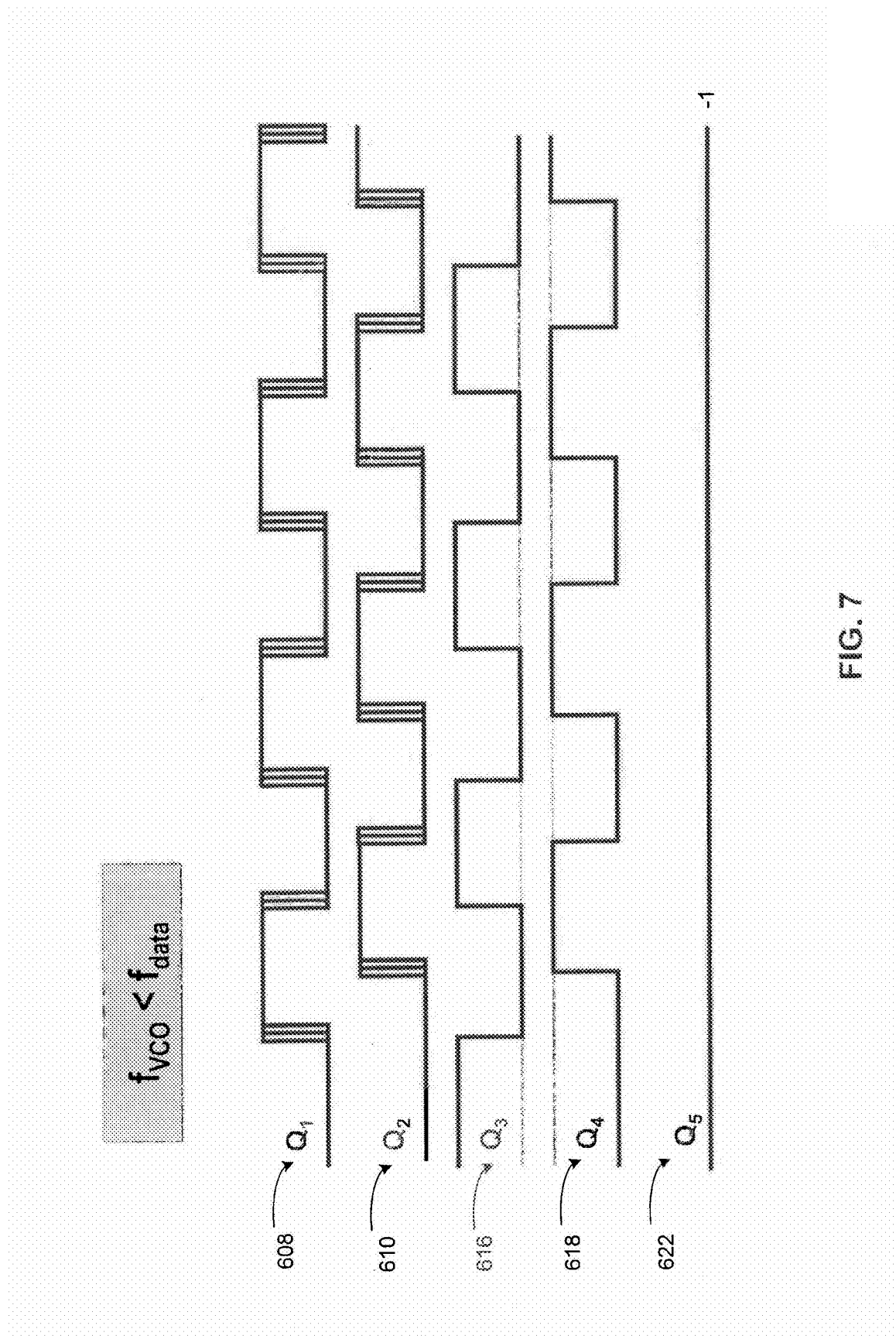
FIG. 7 is an example that illustrates the resolution of the "dead zone" problem according to an embodiment of the present invention.

FIG. 7 shows example timing diagrams of signals $Q_1$ 608, $Q_2$ 610, $Q_3$ 616, $Q_4$ 618, and $Q_5$ 622 that illustrate the performance of frequency detector 600 within the "dead zone" range. Specifically, FIG. 7 shows the same example scenario described above in FIG. 5 with reference to frequency detector 300 to illustrate the "dead zone" problem.

In the example of FIG. 7, the frequency of clock signal 306 ($f_{VCO}$) is lower than the frequency of the data signal ($f_{DATA}$) (i.e., $\Delta f = f_{VCO} - f_{DATA} < 0$). Thus, as shown in FIG. 7, signal $Q_1$ 608 leads signal $Q_2$ 610. Because of the presence of jitter in clock signal 306 and/or ISI on the data signal, signals $Q_1$ 608 and $Q_2$ 610 exhibit glitches, which are reflected as unwanted toggling at the zero crossings of signals $Q_1$ 608 and $Q_2$ 610, as shown in FIG. 7. As a result, signal $Q_3$ 616 toggles as shown in FIG. 7 (instead of having a solid logic low value) and has an average value of zero (over the pre-defined time interval).

Signal $Q_4$ 618 is generated by sampling signal $Q_1$ 608 at the rising edges of signal $Q_2$ 610. Thus, signal $Q_4$ 618 is a phase shifted version of signal $Q_3$ 616. Specifically, signal $Q_4$ 618 leads signal $Q_3$ 616 (as shown in FIG. 7) when $\Delta f = f_{VCO} - f_{DATA} < 0$, and lags signal $Q_3$ 616 when $\Delta f > 0$.

Signal $Q_5$ 622 indicates which of signals $Q_3$ 616 and $Q_4$ 618 leads the other, and thus the polarity of $\Delta f$. In particular, when signal $Q_4$ 618 leads signal $Q_3$ 616, signal $Q_5$ 622 will be a logic low (e.g., $-1$), indicating that the frequency of clock signal 306 ($f_{VCO}$) is lower than the frequency of the data signal ($f_{DATA}$) (i.e., $\Delta f < 0$). On the other hand, when signal $Q_4$ 618 lags signal $Q_3$ 616, signal $Q_5$ 622 will be a logic high (e.g., $+1$), indicating that the frequency of clock signal 306 ($f_{VCO}$) is higher than the frequency of the data signal ($f_{DATA}$) (i.e., $\Delta f > 0$).

In the example of FIG. 7, with $\Delta f = f_{VCO} - f_{DATA} < 0$, signal $Q_4$ 618 leads signal $Q_3$ 616, resulting in signal $Q_5$ 622 being a logic low (e.g., $-1$). Signal $Q_5$ 622 would take a logic high value (e.g., $+1$) when $\Delta f = f_{VCO} - f_{DATA} > 0$. As such, signal $Q_5$ 622 provides an indication of the polarity of $\Delta f$ when $\Delta f$ is within the "dead zone" range.

In an embodiment, samples of signals $Q_1$ 608, $Q_2$ 610, $Q_3$ 616, $Q_4$ 618, and $Q_5$ 622 (which may be digital samples) are provided (at a pre-determined rate) to a VCO calibration module. The VCO calibration module processes the samples to determine the magnitude and polarity of $\Delta f$ and to determine a calibration code for the VCO based on the determined $\Delta f$ information.

Figure 8:
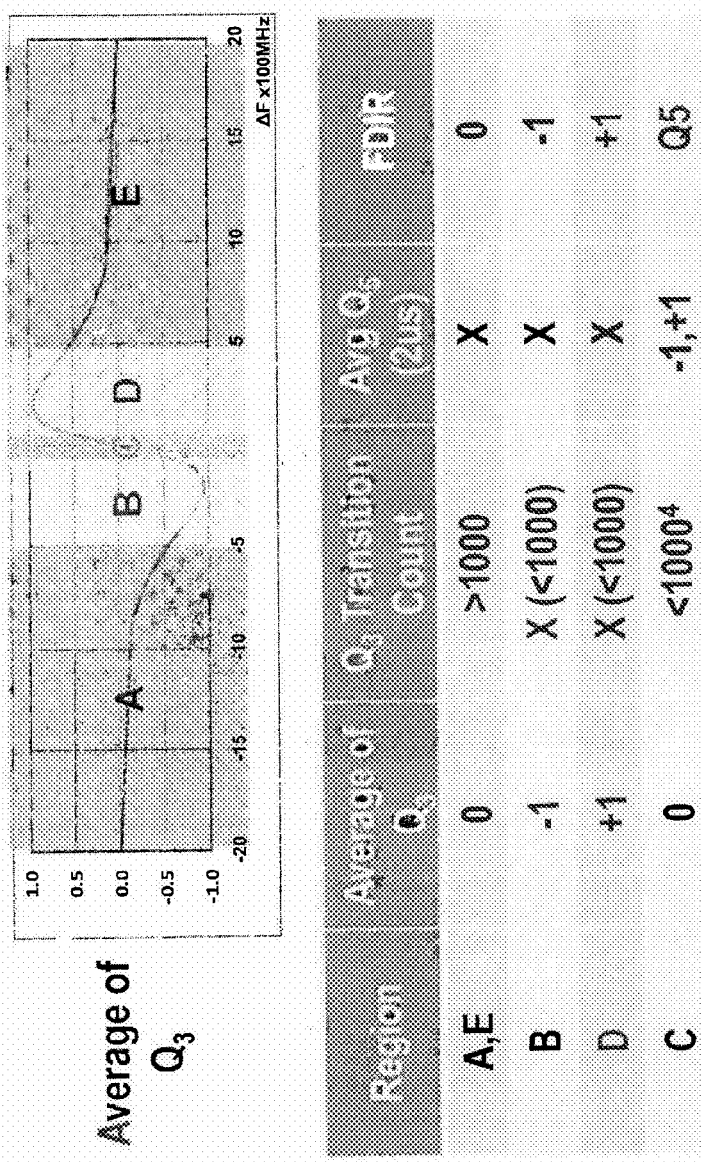
FIG. 8 illustrates an example heuristic algorithm according to an embodiment of the present invention.

FIG. 8 illustrates an example heuristic algorithm 800 according to an embodiment of the present invention. Example heuristic algorithm 800 can be used, for example, by a VCO calibration module, such as VCO calibration module 206, to determine the polarity of $\Delta f$.

Example heuristic algorithm 800 uses one or more of signals $Q_1$ 608, $Q_2$ 610, $Q_3$ 616, $Q_4$ 618, and $Q_5$ 622 from frequency detector 600 to determine an FDIR (Frequency Direction) value, representative of the polarity of $\Delta f$. In an embodiment, the FDIR value is equal to $+1$ when the VCO clock frequency $f_{VCO}$ is larger than the data signal frequency $f_{DATA}$ (i.e., $\Delta f > 0$), and to $-1$ when the VCO clock frequency $f_{VCO}$ is lower than the data signal frequency $f_{DATA}$ ($\Delta f < 0$).

According to example heuristic algorithm 800, the $\Delta f$ range is divided, into five regions (A, B, C, D, and E) based on the magnitude of $\Delta f$. Region C corresponds to the "dead zone" described above. The FDIR value can take values of $-1$, 0, or $+1$, depending on the $\Delta f$ region that $\Delta f$ falls in. In an embodiment, to determine the $\Delta f$ region in which $\Delta f$ falls and the FDIR value, the average and the number of transitions (transition count) of signal $Q_3$ 616 (over the pre-determined time interval) are examined as described below.

If the average of $Q_3$ 616 is zero and the transition count of signal $Q_3$ 616 is above a pre-defined (also programmable) threshold (e.g., 1000), then $\Delta f$ is determined to be in regions A or E. Typically, in this case, signal $Q_5$ 622 is toggling rapidly and is not valid, and the FDIR value is equal to the average of $Q_3$ 616 (i.e., zero). This indicates to the VCO calibration module that $\Delta f$ is large enough that a coarse frequency search over the VCO frequency range is first needed to bring $\Delta f$ down to a range in which a finer search can be performed (i.e., to discover the correct VCO frequency band based on the data rate).

If, however, the average of $Q_3$ 616 is zero (or close to zero) and the transition count of signal $Q_3$ 616 is below the predefined threshold, then $\Delta f$ is determined to be in region C (i.e., the "dead zone"). In this case, signal $Q_5$ 622 (as well as its average value) is either a logic low (e.g., −1) or a logic high (e.g., +1), and the FDIR value is equal to the value of signal $Q_5$ 622 (either −1 or +1).

On the other hand, if the average of $Q_3$ 616 is equal to −1 (or close to −1), then $\Delta f$ is determined to be in region B and the FDIR value is equal to −1; and if the average of $Q_3$ 616 is equal to +1 (or closer to +1), then $\Delta f$ is determined to be in region D and the FDIR value is equal to +1. Accordingly, in these cases, the determination of the $\Delta f$ region and the FDIR value is made solely based on the average value of signal $Q_3$ 616 (the FDIR value is equal to the average of signal $Q_3$ 616). The transition count of signal $Q_3$ 616 is lower than the predefined threshold in these cases (typically $Q_3$ 616 is solid), but is not relevant for the determination of the $\Delta f$ region and the FDIR value. The same applies to signal $Q_5$ 622, which is not toggling and is not valid in these cases.

Thus, according to example heuristic algorithm 800, the FDIR value is equal to either the average value of signal $Q_3$ 616 (in regions A, E, B, and D, i.e., outside the "dead zone") or to the value of signal $Q_5$ 622 (in region C, i.e., inside the "dead zone").

As noted above, the FDIR value indicates to a VCO calibration module, for example, whether the VCO clock frequency is currently lower/higher than the data rate (FDIR is −1 or +1) or if the VCO clock frequency is currently too far from the data rate (FDIR is 0). In an embodiment, based on a series of FDIR values, the VCO calibration module (e.g., VCO calibration module 206) performs a frequency search scheme to determine a calibration code (or VCO calibration state) that brings the VCO clock frequency sufficiently close to the data rate (i.e., a target calibration code).

In an embodiment, the frequency search scheme includes a discovery phase, a binary search phase, and a monitoring phase. In the discovery phase, the VCO calibration module performs a coarse search over the operating frequency range of the VCO to bring the VCO clock frequency to within a small range of the data rate (e.g., into regions B, C, or D). The discovery phase is illustrated in FIG. 9, which shows an example discovery phase scheme 900 for an 11-bit VCO (i.e., having 2048 calibration states) according to an embodiment of the present invention.

Figure 9:
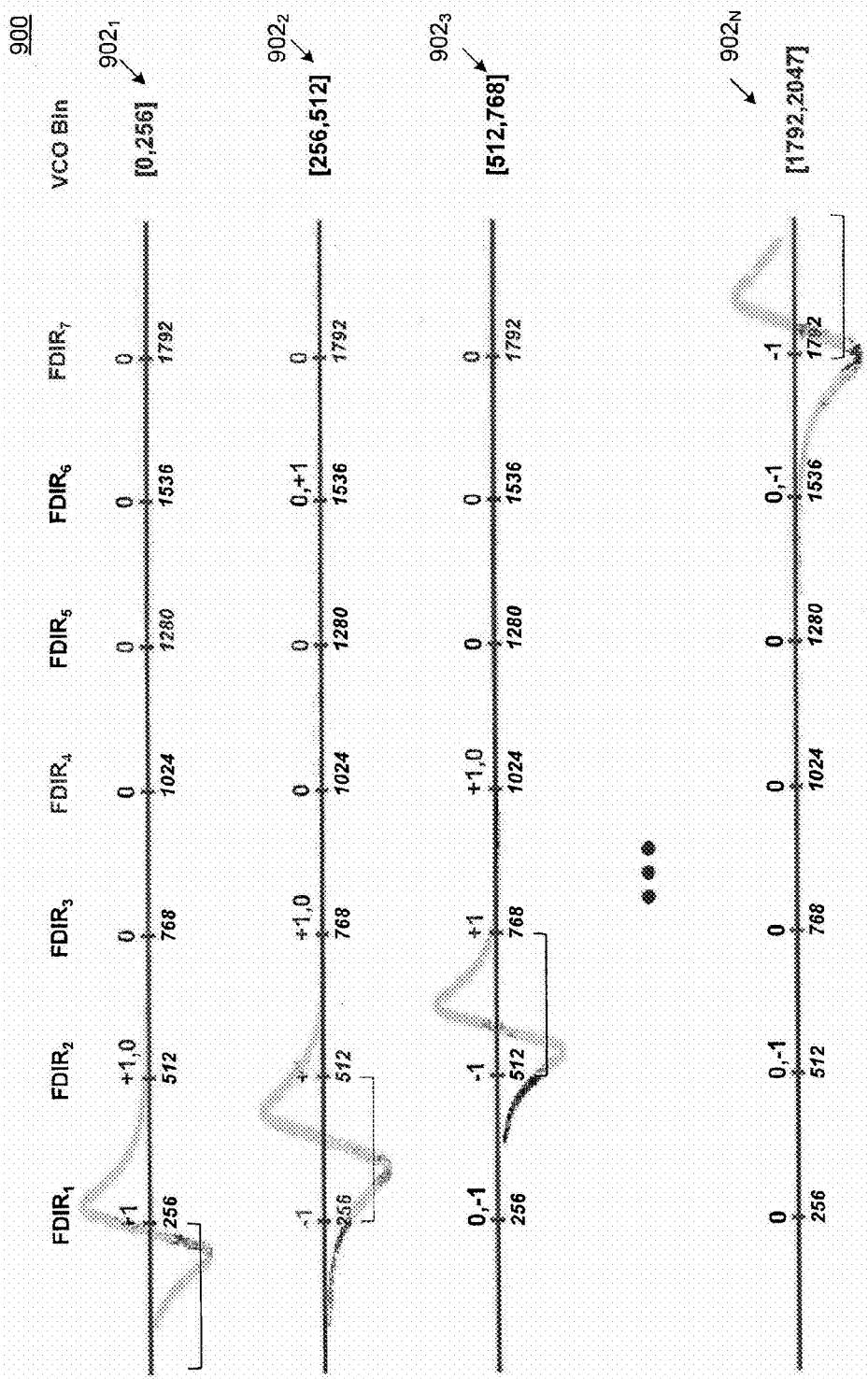
FIG. 9 illustrates an example discovery phase of a frequency search scheme according to an embodiment of the present invention.

As shown in FIG. 9, the operating frequency range of the VCO is divided into a plurality of VCO bins 902 (e.g., 8 VCO bins), each VCO bin 902 corresponding to a respective band of the VCO frequency range and to a respective subset of calibration codes (calibration states) of the VCO. For example, VCO bin 902$_1$ corresponds to calibration codes 0 to 256 of the VCO. VCO bins 902 may or may not be equally-spaced, and may or may not be non-overlapping.

In an embodiment, the discovery phase includes a linear search over VCO bins 902. Starting from VCO bin 902$_1$ (alternatively, the linear search can start from VCO bin 902$_N$), the VCO is calibrated with calibration code 256, and the resulting FDIR value is examined. If the resulting FDIR value is +1, then it can be determined that the VCO clock frequency is currently higher than the data rate ($\Delta f$ is in region D), and that the target calibration code is within VCO bin 902$_1$. The discovery phase is thus terminated, and the frequency search scheme proceeds to the binary search phase.

If, however, the resulting FDIR value for calibration code 256 is −1, then it can be determined that the VCO clock frequency is lower than the data rate ($\Delta f$ is in region B), and that the target calibration code is outside of VCO bin 902$_1$. Accordingly, the VCO is next calibrated with calibration code 512, and the resulting FDIR value is examined.

If the resulting FDIR value is +1, then it can be determined that the VCO clock frequency is currently higher than the data rate ($\Delta f$ is in region D), and that the target calibration code is within VCO bin 902$_2$. The discovery phase is thus terminated, and the frequency search scheme proceeds to the binary search phase.

On the other hand, if the resulting FDIR value for calibration code 512 is −1, then it can be determined that the VCO clock frequency is lower than the data rate ($\Delta f$ is in region B), and that the target calibration code is outside of VCO bins 902$_1$ and 902$_2$. Accordingly, the VCO is next calibrated with calibration code 768, and the same process as for calibration code 512 is repeated.

The linear search can thus proceed as described above until a VCO bin in which the FDIR value transitions from −1 to +1 can be found. Note that in the case that the target calibration code is within VCO bin 902$_N$ (i.e., the last VCO bin), a FDIR value of −1 will result at calibration code 1792. The discovery phase is terminated without checking calibration code 2047.

In another embodiment, the discovery phase is performed by generating a series of consecutive FDIR values (FDIR$_1$ to FDIR$_N$), with each FDIR value resulting from calibrating the VCO with a calibration code from one VCO bin. Then the consecutive FDIR values are examined against known patterns to determine the target VCO bin (i.e., the VCO bin that includes the target calibration code). For instance, in the example of FIG. 9, consecutive FDIR values (FDIR$_1$ to FDIR$_7$) can be generated by calibrating the VCO consecutively to calibration codes 256, 512, 768, 1024, 1280, 1536, and 1792. Then, based on the consecutive FDIR values, the target VCO bin can be determined. For example, a FDIR pattern of FDIR$_0$=0/−1; FDIR$_2$=−1; FDIR$_3$=+1; FDIR$_4$=+1/0; FDIR$_5$=0; FDIR$_6$=0; and FDIR$_7$=0 indicates that the target VCO calibration is in VCO bin 902$_3$ [512, 768].

Once a target VCO bin is identified, the frequency search proceeds to the binary search phase. In the binary search phase, a fine frequency search within the identified VCO bin (or the identified VCO frequency band) is performed to determine two consecutive calibration codes (within the identified VCO bin) for which the FDIR value transitions from −1 to +1. The FDIR transition from −1 to +1 indicates a negative to positive $\Delta f$ transition (i.e., that $\Delta f$ is very close to zero).

Figure 10:
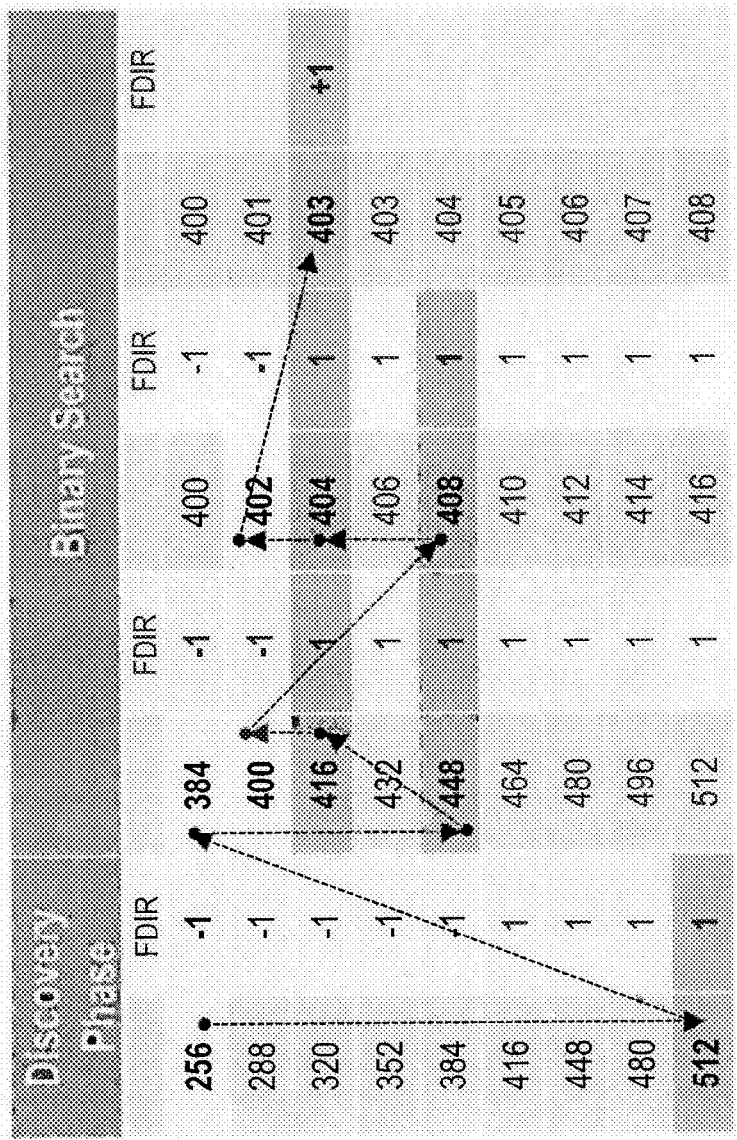
FIG. 10 illustrates an example frequency search scheme according to an embodiment of the present invention.

FIG. 10 is an example 1000 that illustrates the binary search phase according to an embodiment of the present invention. As shown in FIG. 10, the binary search phase is preceded by a discovery phase, as described above. In example 1000, the FDIR values for calibration codes 256 and 512 are −1 and +1, respectively. Accordingly, VCO bin [256, 512] is identified as the target VCO bin in the discovery phase.

In the binary search phase, the search proceeds according to a binary search algorithm, starting with a search window that spans all codes between calibration codes 256 and 512. Thus, in the first step, the VCO is calibrated with calibration code 384 (which corresponds to the middle code in the search window [256,512]), and the resulting FDIR value is examined. In example 1000, the resulting FDIR value for code 384 is −1, indicating that the target VCO calibration code is between calibration codes 384 and 512.

Accordingly, the search window is updated to [384,512] and the middle code (448) in the updated search window is tested. The resulting FDIR value for code 448 is +1, which indicates that the target VCO calibration code is between calibration codes 384 and 448.

The binary search proceeds iteratively in the manner described above until two consecutive calibration codes for which the FDIR value transitions from −1 to +1 are determined. In example 1000, as shown in FIG. 10, this occurs for calibration codes 402 (FDIR=−1) and 403 (FDIR=+1).

Subsequently, one of the two calibration codes is selected as the code with which to calibrate the VCO. In an embodiment, the calibration code with FDIR=+1 is selected. Alternatively, the calibration code with FDIR=−1 is selected. In a further embodiment, the frequency search scheme includes a monitoring phase to determine which of the two calibration codes is selected. In an embodiment, the monitoring phase includes monitoring and determining the period of signal $Q_1$ 608 (or signal $Q_2$ 610) for each of the two calibration codes, and selecting the code associated with the higher $Q_1$ 608 ($Q_2$ 610) period. It is noted that either signal $Q_1$ 608 or $Q_2$ 610 may be used as both signals have a period equal to $(1/\Delta f)$. In another embodiment, the signal having the larger period over the monitoring phase (between signals $Q_1$ 608 and $Q_2$ 610) is monitored during the monitoring phase (over the monitoring phase, $Q_1$ 608 and $Q_2$ 610 may have different periods, even though they have equal long term average periods). In a further embodiment, signals $Q_3$ 616, $Q_4$ 618, and/or $Q_5$ 622 are used (in the same way as $Q_1$ 608 and $Q_2$ 610) to select the calibration code.

As would be understood by a person of skill in the art based on the teachings herein, the monitoring phase may be performed subsequent to the binary search phase or within the binary search phase (i.e., the period of $Q_1$ 608 or $Q_2$ 610 is determined together with the FDIR value for each particular code being tested).

After determining a calibration code for the VCO, the VCO calibration module (e.g., VCO calibration module 206) provides the calibration code to the VCO. In an embodiment, the calibration code is input into a control register of the VCO. The calibration code calibrates the VCO into a calibration state that brings the VCO clock frequency sufficiently close to the rate of the data signal. In an embodiment, the calibration code calibrates the VCO by digitally controlling (turning on/off) one or more capacitor banks within the VCO in order to output the desired VCO clock frequency.

Figure 11:
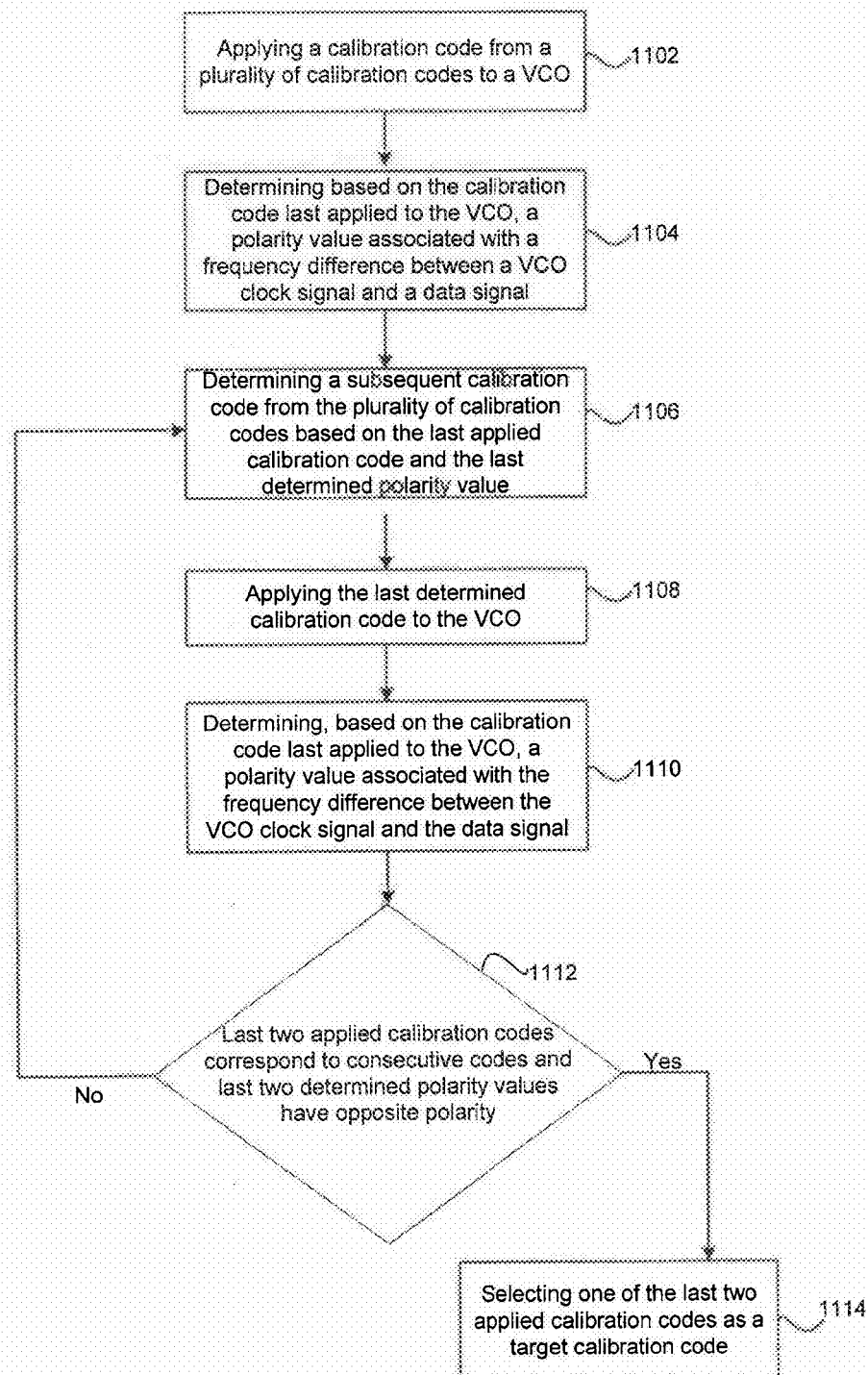
FIG. 11 is a process flowchart that illustrates a method according to an embodiment of the present invention.

FIG. 11 is a process flowchart 1100 that illustrates a method for reference-less calibration of a VCO according to an embodiment of the present invention. Process flowchart 1100 may be performed by a VCO calibration module, such as VCO calibration module 206, for example.

Process 1100 begins in step 1102, which includes applying a calibration code from a plurality of calibration codes to the VCO. In an embodiment, the plurality of calibration codes include a numbered sequence of calibration codes, each calibration code in the numbered sequence corresponding to a respective frequency of the VCO clock signal from an operating frequency range of the VCO. In another embodiment, the operating frequency range of the VCO is divided into a plurality of VCO bins, each VCO bin corresponding to a respective frequency band of the VCO and to a respective subset of calibration codes from the plurality of calibration codes.

In step 1104, process 1100 includes determining, based on the calibration code last applied to the VCO, a polarity value associated with a frequency difference between a VCO clock signal and a data signal. In an embodiment, the polarity value determined in step 1104 is positive, which allows identifying a target VCO bin (which includes a target calibration code that frequency calibrates the VCO clock signal to the data signal) as ending with the calibration code applied in step 1102. In another embodiment, the polarity value determined in step 1104 is negative, which allows identifying the target VCO bin as beginning with the calibration code applied in step 1102.

Subsequently, in step 1106, process 1100 includes determining a subsequent calibration code from the plurality of calibration codes based on the calibration code last applied to the VCO and the last determined polarity value. In an embodiment, the calibration code applied to the VCO in step 1102 corresponds to a middle code (i.e. located at the middle) of a subset of calibration codes associated with the identified target VCO bin, and the calibration code determined in step 1106 corresponds to a middle code between the calibration code applied to the VCO code in step 1102 and an end calibration code of the target VCO bin.

In step 1108, process 1100 includes applying the last determined calibration code to the VCO. Then, in step 1110, process 1100 includes determining, based on the calibration code last applied to the VCO (i.e., in step 1108) a polarity value associated with the frequency difference between the VCO clock signal and the data signal. In an embodiment, the polarity value determined in step 1104 is negative and the polarity value determined and the polarity value determined in step 1110 is positive. Thus, the target VCO bin is identified as beginning with the calibration code applied to the VCO in step 1102 and ending with the calibration code applied to the VCO in step 1108.

Subsequently, in step 1112, process 1100 includes testing whether or not the last two calibration codes applied to the VCO correspond to consecutive codes of the plurality of calibration codes (i.e., consecutive in the numbered sequence of calibration codes) and the last two determined polarity values have opposite polarity. If both conditions are true, process 1100 proceeds to step 1114, which includes selecting one of the last two applied calibration codes as a target calibration code. In an embodiment, the selected calibration code applied corresponds to a lower value of the frequency difference. Otherwise, process 1100 proceeds back to step 1106. Note that each time a new iteration in process 1100 is performed (i.e., steps 1106, 1108, 1110, and 1112), the target VCO bin is updated and narrowed until the exit condition in step 1112 is satisfied.

In an embodiment, to ensure that frequency lock is achieved, the periods of one or more of signals $Q_1$ 608, $Q_2$ 610, and $Q_3$ 616 are monitored over a defined time interval, after step 1114, and compared to a pre-determined value. When frequency lock is achieved, signals $Q_1$ 608, $Q_2$ 610, and $Q_3$ 616 will be slow moving (i.e., will toggle at a very low rate). As such, when the periods of signals $Q_1$ 608, $Q_2$ 610, and/or $Q_3$ 616 are above the pre-determined value, it is determined that frequency lock has been achieved. Otherwise, it is determined that frequency lock has not been achieved (due some error), and process 1100 is repeated.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A method for determining a polarity of a frequency difference between a data signal and a clock signal, comprising:
    sampling the clock signal according to an in-phase component and a quadrature phase component of the data signal, respectively, to generate a first signal and a second signal;
    sampling the second signal according to the first signal to generate a third signal;
    sampling the first signal according to the second signal to generate a fourth signal; and
    sampling the third signal according to the fourth signal to generate a fifth signal, wherein the fifth signal provides the polarity of the frequency difference between the data signal and the clock signal.

2. The method of claim 1, further comprising:
    delaying the in-phase component to generate the quadrature phase component of the data signal.

3. The method of claim 1, wherein the first, second, third, fourth, and fifth signals are high-speed differential signals.

4. The method of claim 1, wherein a period of the first signal and the second signal is proportional to the frequency difference between the data signal and the clock signal.

5. The method of claim 1, wherein the first signal leads the second signal when the frequency difference between the data signal and the clock signal is negative.

6. The method of claim 1, wherein the first signal lags the second signal when the frequency difference between the data signal and the clock signal is positive.

7. The method of claim 1, wherein the polarity of the frequency difference is provided by the fifth signal when the frequency difference is within a defined frequency difference range and by an average value of the third signal when the frequency difference is outside the defined frequency difference range.

8. The method of claim 7, wherein when the frequency difference is within the defined frequency difference range, the average value of the third signal is substantially close to zero and a transition count of the third signal is above a pre-determined threshold.

9. The method of claim 7, wherein when the frequency difference is within the defined frequency difference range, the fifth signal takes a logic high value when the polarity of the frequency difference is positive and a logic low value when the polarity of the frequency difference is negative.

10. The method of claim 7, wherein the defined frequency difference range straddles zero.

11. A method for calibrating a Voltage Controlled Oscillator (VCO), comprising:
    sampling a VCO clock according to a first component and a second component of a data signal, respectively, to generate a first signal and a second signal;
    sampling the second signal according to the first signal to generate a third signal;
    sampling the first signal according to the second signal to generate a fourth signal;
    sampling the third signal according to the fourth signal to generate a fifth signal; and
    controlling the VCO according to the fifth signal when a frequency difference between the data signal and the VCO clock is within a defined frequency difference range.

12. The method of claim 11, wherein the first component and the second component correspond respectively to an in-phase component and a quadrature phase component of the data signal.

13. The method of claim 11, wherein the fifth signal provides a polarity of the frequency difference between the data signal and the VCO clock.

14. The method of claim 11, further comprising:
    controlling the VCO according to an average value of the third signal when the frequency difference is outside the defined frequency difference range.

15. The method of claim 11, wherein the defined frequency difference range straddles zero.

16. A method for calibrating a clock signal, comprising:
    sampling the clock signal according to an in-phase component and a quadrature phase component of a data signal, respectively, to generate a first signal and a second signal;
    sampling the second signal according to the first signal to generate a third signal;
    sampling the first signal according to the second signal to generate a fourth signal; and
    sampling the third signal according to the fourth signal to generate a fifth signal.

17. The method of claim 16, wherein the fifth signal provides a polarity of a frequency difference between the data signal and the clock signal when the frequency difference is within a defined frequency difference range.

18. The method of claim 17, further comprising:
    adjusting the clock signal according to the fifth signal when the frequency difference between the data signal and the clock signal is within the defined frequency difference range; and
    adjusting the clock signal according to an average value of the third signal when the frequency difference is outside the defined frequency difference range.

19. The method of claim 17, wherein the defined frequency difference range straddles zero.

20. The method of claim 16, wherein the clock signal is a Voltage Controlled Oscillator (VCO) clock.

* * * * *